(12) United States Patent
Kelley

(10) Patent No.: US 7,969,226 B2
(45) Date of Patent: Jun. 28, 2011

(54) HIGH TEMPERATURE GATE DRIVERS FOR WIDE BANDGAP SEMICONDUCTOR POWER JFETS AND INTEGRATED CIRCUITS INCLUDING THE SAME

(75) Inventor: Robin Kelley, Starkville, MS (US)

(73) Assignee: Semisouth Laboratories, Inc., Starkville, MS (US)

( * ) Notice: Subject to any disclaimer, the term of this patent is extended or adjusted under 35 U.S.C. 154(b) by 257 days.

(21) Appl. No.: 12/437,173

(22) Filed: May 7, 2009

(65) Prior Publication Data

US 2010/0283061 A1 Nov. 11, 2010

(51) Int. Cl.
*H03K 17/56* (2006.01)
(52) U.S. Cl. .................................. 327/424; 327/430
(58) Field of Classification Search .................. 327/424, 327/430
See application file for complete search history.

(56) References Cited

U.S. PATENT DOCUMENTS

| | | | |
|---|---|---|---|
| 3,700,981 A | 10/1972 | Masuhara et al. | |
| 3,775,693 A | 11/1973 | Proebsting | |
| 4,042,839 A | 8/1977 | Araki | |
| 4,417,162 A | 11/1983 | Keller et al. | |
| 2007/0262793 A1 | 11/2007 | Kapoor | |
| 2008/0080661 A1 | 4/2008 | Tobita | |

OTHER PUBLICATIONS

Neaman, D.A., "Electrical Circuit Analysis and Design," Irwin, 1996, pp. 934-936.
Notification of Transmittal of the International Search Report and the Written Opinion of the International Searching Authority, or the Declaration, Dated Nov. 29, 2010; International Search Report, Dated Nov. 29, 2010; Written Opinion of the International Searching Authority, Dated Nov. 29, 2010.

*Primary Examiner* — Minh-Loan T Tran
(74) *Attorney, Agent, or Firm* — Morris, Manning & Martin, LLP; Christopher W. Raimund

(57) ABSTRACT

Gate drivers for wide bandgap (e.g., >2 eV) semiconductor junction field effect transistors (JFETs) capable of operating in high ambient temperature environments are described. The wide bandgap (WBG) semiconductor devices include silicon carbide (SiC) and gallium nitride (GaN) devices. The driver can be a non-inverting gate driver which has an input, an output, a first reference line for receiving a first supply voltage, a second reference line for receiving a second supply voltage, a ground terminal, and six Junction Field-Effect Transistors (JFETs) wherein the first JFET and the second JFET form a first inverting buffer, the third JFET and the fourth JFET form a second inverting buffer, and the fifth JFET and the sixth JFET form a totem pole which can be used to drive a high temperature power SiC JFET. An inverting gate driver is also described.

22 Claims, 10 Drawing Sheets

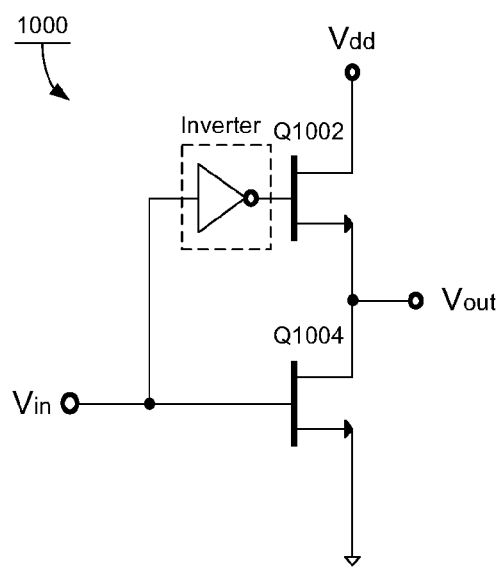 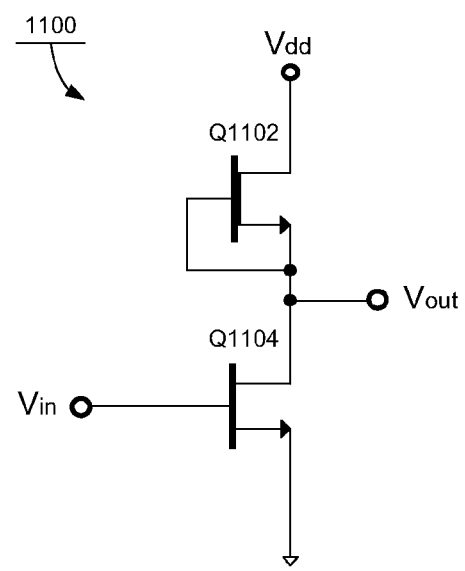
FIG. 10     FIG. 11

HIGH TEMPERATURE GATE DRIVERS FOR WIDE BANDGAP SEMICONDUCTOR POWER JFETS AND INTEGRATED CIRCUITS INCLUDING THE SAME

TECHNICAL FIELD

The present invention relates generally to gate drivers and integrated circuits including the same, and more particularly, to a high temperature capable gate driver for wide bandgap semiconductor power JFETs.

BACKGROUND OF THE TECHNOLOGY

A major end-use application for silicon carbide (SiC) junction field effect transistors (JFETs) is in power electronics designed for high ambient temperature environments. While the exceptional properties of the SiC JFET make it capable of reliable operation at high temperatures, there is currently a lack of high-temperature-capable gate drivers. Current solutions include arranging the power electronic controls in a lower temperature environment or installing extra cooling systems to maintain safe operating temperatures for part or all of the system. However, for optimal performance of any semiconductor power transistor, the gate driver circuit should be located as close as possible to the power transistor in order to reduce parasitic affects (e.g., undesirable resonance and/or ground noise on the gate control signals). These types of unwelcome parasitic affects may cause erratic switching of the power transistor and can potentially lead to device or system failure.

The typical drive method for power transistors is a totem pole circuit having a pull-up transistor and a pull-down transistor. These transistors are usually metal-oxide-semiconductor field effect transistors (MOSFETs) or bipolar junction transistors (BJTs), and are connected to a unipolar supply voltage (i.e., one positive and one ground), or two voltage supplies (i.e., one positive and one negative). [1] The most common and simplest form of a totem pole circuit is built using complementary logic (e.g., NPN and PNP or P-channel and N-channel devices). However, the same functionality can be achieved with two N-type devices.

A totem pole acts as a current amplifier and if necessary a voltage level shifter, accepting a low current drive signal at the input and generating a higher current for the load transistor. The pull-up and pull-down power supply voltages do not have to match the logic high and logic low voltages of the input control signal. Like other power transistors, the SiC power JFET can also be driven by a totem pole driver. This task can be accomplished discretely using Si BJT/MOSFETs, or even insulated gate field effect transistors (IGFETs) or metal-insulator-semiconductor field effect transistors (MISFETs). [1-4]. These devices, however, are not capable of operating at the maximum temperature rating of SiC power JFETs (i.e., at temperatures exceeding 300° C.).

Accordingly, there still exists a need for gate drivers capable of operating at the maximum temperature rating of SiC power JFETs. These drivers would allow for optimal use of SiC power JFETs (enhancement-mode or depletion-mode) in high temperature applications.

SUMMARY

The present invention, in one aspect, relates to a high temperature capable non-inverting gate driver. In one embodiment, the gate driver includes: (i) an input, (ii) an output, (iii) a first reference line for receiving a first supply voltage, (iv) a second reference line for receiving a second supply voltage, (v) a ground terminal, (vi) a first Junction Field-Effect Transistor ("JFET"), (vii) a second JFET, (viii) a third JFET, (ix) a fourth JFET, (x) a fifth JFET, and (xi) a sixth JFET. Each of the first JFET, the second JFET, the third JFET, the fourth JFET, the fifth JFET and the sixth JFET has a gate terminal, a source terminal and a drain terminal.

In one embodiment, the gate driver is configured such that:
(i) the gate terminal of the first JFET is electrically coupled to the source terminal of the first JFET, and the drain terminal of the first JFET is electrically coupled to the first reference line for receiving the first supply voltage, respectively;
(ii) the gate terminal of the second JFET is electrically coupled to the input; the drain terminal of the second JFET is electronically coupled to the gate terminal and the source terminal of the first JFET, and the source terminal of the second JFET is electrically coupled to the second reference line for receiving the second supply voltage, respectively;
(iii) the gate terminal of the third JFET is electrically coupled to the source terminal of the third JFET, and the drain terminal of the third JFET is electrically coupled to the first reference line for receiving the first supply voltage and the drain terminal of the first JFET, respectively;
(iv) the gate terminal of the fourth JFET is electrically coupled to the source terminal and the gate terminal of the first JFET and the drain terminal of the second JFET, the drain terminal of the fourth JFET is electronically coupled to the gate terminal and the source terminal of the third JFET, and the source terminal of the fourth JFET is electrically coupled to the second reference line for receiving the second supply voltage and the source terminal of the second JFET, respectively;
(v) the gate terminal of the fifth JFET is electrically coupled to the source terminal and the gate terminal of the third JFET, and the drain terminal of the fourth JFET, the drain terminal of the fifth JFET is electrically coupled to the first reference line for receiving the first supply voltage, the drain terminal of the third JFET, and the drain terminal of the first JFET, and the source terminal of the fifth JFET is electrically coupled to the output, respectively; and
(vi) the gate terminal of the sixth JFET is electrically coupled to the gate terminal and the source terminal of the first JFET, the drain terminal of the second JFET, and the gate terminal of the fourth JFET, the drain terminal of the sixth JFET is electronically coupled to the source terminal of the fifth JFET and the output, and the source terminal of the sixth JFET is electrically coupled to the source terminal of the second JFET, the source terminal of the fourth JFET, and the second reference line for receiving the second supply voltage, respectively.

In one embodiment, the first JFET, the second JFET, the third JFET, the fourth JFET, the fifth JFET, and the sixth JFET are SiC N-Channel JFETs.

In one embodiment, the first JFET and the third JFET are depletion-mode type JFETs and the second JFET, the fourth JFET, the fifth JFET, and the sixth JFET are enhancement-mode type JFETs.

In one embodiment, the first reference line for receiving the first supply voltage is electrically coupled to a ground referenced positive source voltage or a switch common referenced positive source voltage, and the second reference line for receiving the second supply voltage is electrically coupled to a ground referenced negative source voltage or a switch common referenced negative source voltage. The gate driver further includes a level-shifting capacitor having a first terminal and a second terminal. The first terminal of the capacitor is electrically coupled to the input, and the second terminal of the capacitor is electrically coupled to the gate terminal of the second JFET.

In one embodiment, the gate driver further has: (i) an enable voltage input for enabling or disabling the output of the gate driver, and (ii) a seventh JFET having a gate terminal, a source terminal and a drain terminal. The gate terminal of the seventh JFET is electrically coupled to the enable voltage input. The source terminal of the seventh JFET is electrically coupled to the ground terminal. The drain terminal of the seventh JFET is electrically coupled to the source terminal and the gate terminal of the first JFET, the drain terminal of the second the JFET, the gate terminal of the fourth JFET, the gate terminal of the sixth JFET, and the source terminal of the seventh JFET is electrically coupled to the ground terminal.

In another embodiment, the first reference line for receiving the first supply voltage is electrically coupled to a ground referenced positive source voltage or a switch common referenced positive source voltage, and the second reference line for receiving the second supply voltage is electrically coupled to the ground terminal or a switch common terminal.

In one embodiment, the gate driver further includes: (i) an enable voltage input for enabling or disabling the output of the gate driver, (ii) a seventh JFET having a gate terminal, a source terminal and a drain terminal, wherein the gate terminal of the seventh JFET is electrically coupled to the enable voltage input, the source terminal of the seventh JFET is electrically coupled to the ground terminal; and the drain terminal of the seventh JFET is electrically coupled to the drain terminal of the fourth JFET, the gate terminal and the source terminal of the third JFET, and the gate terminal of the fifth JFET, respectively, and (iii) an eighth JFET having a gate terminal, a source terminal and a drain terminal, wherein the gate terminal of the eighth JFET is electrically coupled to the enable voltage input and the gate terminal of the seventh JFET, the drain terminal of the eighth JFET is electrically coupled to the drain terminal of the sixth JFET, and the source terminal of the fifth JFET, and the output, the source terminal of the eighth JFET is electrically coupled to the ground terminal, respectively.

In one embodiment, the input to the gate driver is a low current ground referenced input logic signal or a low current switch common referenced input logic signal. The output of the gate driver is a ground referenced signal or a switch common referenced signal.

In another aspect, the present invention relates to a high temperature capable inverting gate driver. In one embodiment, the inverting gate driver includes: (i) an input, (ii) an output, (iii) a first reference line for receiving a first supply voltage, (iv) a second reference line for receiving a second supply voltage, (v) a ground terminal, (vi) a first JFET, (vii) a second JFET, (viii) a third JFET, (ix) a fourth JFET, (x) a fifth JFET, and (xi) a sixth JFET. Each of the first JFET, the second JFET, the third JFET, the fourth JFET, the fifth JFET and the sixth JFET has a gate terminal, a source terminal and a drain terminal.

In one embodiment, the gate driver is configured such that:
  (i) the gate terminal of the first JFET is electrically coupled to the source terminal of the first JFET, and the drain terminal of the first JFET is electrically coupled to the first reference line for receiving the first supply voltage, respectively;
  (ii) the gate terminal of the second JFET is electrically coupled to the input, the drain terminal of the second JFET is electronically coupled to the gate terminal and the source terminal of the first JFET, and the source terminal of the second JFET is electrically coupled to the second reference line for receiving the second supply voltage, respectively;
  (iii) the gate terminal of the third JFET is electrically coupled to the source terminal of the third JFET, and the drain terminal of the third JFET is electrically coupled to the first reference line for receiving the first supply voltage and the drain terminal of the first JFET, respectively;
  (iv) the gate terminal of the fourth JFET is electrically coupled to the source terminal and the gate terminal of the first JFET and the drain terminal of the second JFET, the drain terminal of the fourth JFET is electronically coupled to the gate terminal and the source terminal of the third JFET, and the source terminal of the fourth JFET is electrically coupled to the second reference line for receiving the second supply voltage and the source terminal of the second JFET, respectively;
  (v) the gate terminal of the fifth JFET is electrically coupled to the source terminal and gate of the first JFET, the drain terminal of the second JFET, and the gate terminal of the fourth JFET, the drain terminal of the fifth JFET is electrically coupled to the first reference line for receiving the first supply voltage, the drain terminal of the third JFET, and the drain terminal of the first JFET, and the source terminal of the fifth JFET is electrically coupled to the output, respectively; and
  (vi) the gate terminal of the sixth JFET is electrically coupled to the gate terminal and the source terminal of the third JFET and the drain terminal of the fourth JFET, the drain terminal of the sixth JFET is electronically coupled to the source terminal of the fifth JFET and the output, and the source terminal of the sixth JFET is electrically coupled to the source terminal of the second JFET, the source terminal of the fourth JFET and the second reference line for receiving the second supply voltage, respectively.

In one embodiment, the first JFET, the second JFET, the third JFET, the fourth JFET, the fifth JFET, and the sixth JFET are SiC N-Channel JFETs.

In one embodiment, the first JFET and the third JFET are depletion-mode type JFETs, and the second JFET, the fourth JFET, the fifth JFET, and the sixth JFET are enhancement-mode type JFETs.

In one embodiment, the first reference line for receiving the first supply voltage is electrically coupled to a ground referenced positive source voltage or a switch common referenced positive source voltage, and the second reference line for receiving the second supply voltage is electrically coupled to a ground referenced negative source voltage or a switch common referenced negative source voltage. The gate driver further includes a level-shifting capacitor having a first terminal and a second terminal, wherein the first terminal of the capacitor is electrically coupled to the input, and the second terminal of the capacitor is electrically coupled to the gate terminal of the second JFET.

In another embodiment, the first reference line for receiving the first supply voltage is electrically coupled to a ground referenced positive source voltage or a switch common referenced positive source voltage, and the second reference line for receiving the second supply voltage is electrically coupled to the ground terminal or a switch common terminal.

In one embodiment, the input to the gate driver is a low current ground referenced input logic signal or a low current switch common referenced input logic signal. The output is a ground referenced signal or a switch common referenced signal.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 10 illustrates an N-channel logic Totem Pole circuit using SiC-type transistors; and FIG. 11 illustrates an N-channel logic depletion load inverter using SiC-type transistors.

DETAILED DESCRIPTION

Figure 1:
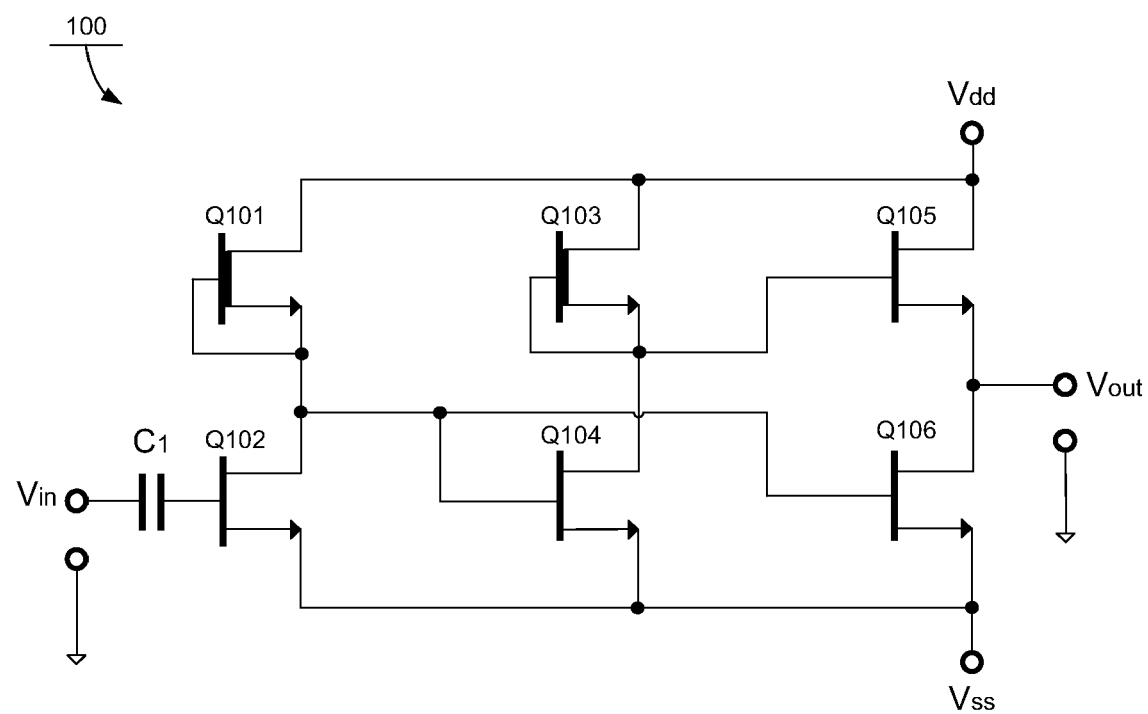
FIG. 1 shows a circuit diagram of a SiC high temperature non-inverting gate driver with a negative source voltage according to one embodiment of the present invention.
Figure 2:
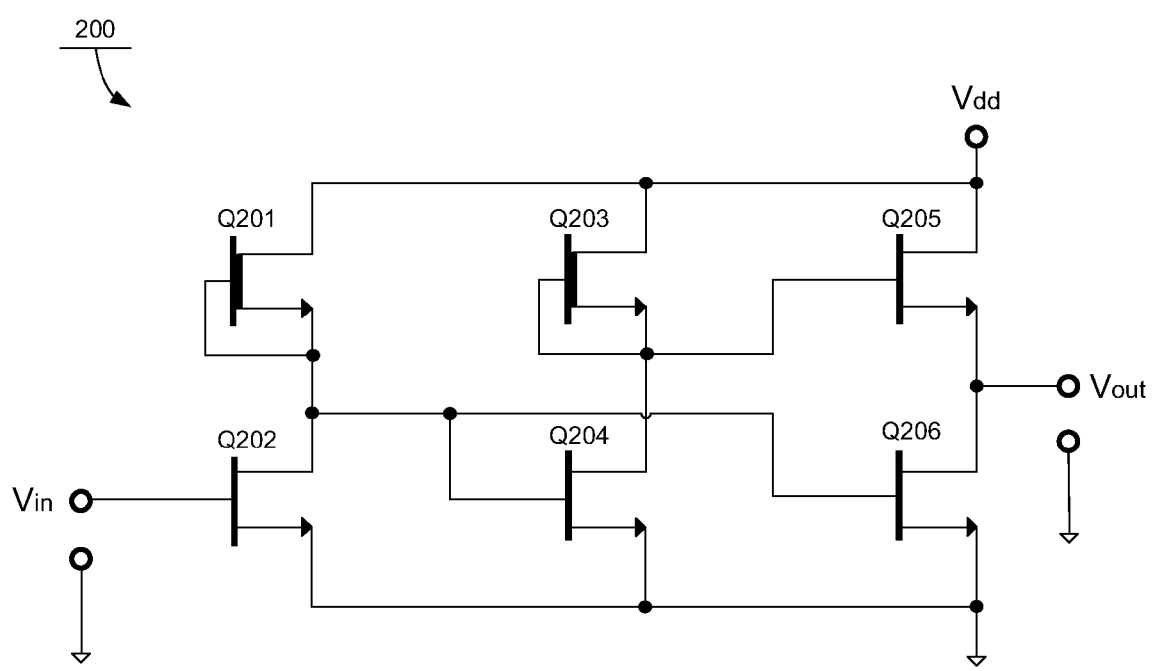
FIG. 2 shows a circuit diagram of a SiC high temperature ground referenced non-inverting gate driver according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings.

Like other power transistors, the SiC power JFET is typically driven by a totem pole driver. While this task can be accomplished discretely using Si BJT/MOSFETs, or even insulated gate field effect transistors (IGFETs) or metal-insulator-semiconductor field effect transistors (MISFETs), there are currently no high temperature small signal discrete components of these types that match the maximum temperature rating of the SiC power JFET.

Small signal, depletion- and enhancement-mode WBG N-channel JFETs can be manufactured based on current SiC power JFET device designs. Since there are currently not any p-type device designs available, a gate driver composed of only small signal, WBG N-channel JFETs requires a circuit design based on N-channel logic rather than CMOS logic. While a similar circuit could be designed using silicon discrete components in either N-channel or CMOS logic, neither would be capable of high temperature operation as would an all SiC circuit.

A circuit using all SiC N-channel logic gate driver using small signal depletion- and enhancement-mode SiC JFETs would enable a high temperature gate driver circuit capable of accepting a digital logic pulse as the input and generating a gate control pulse of the correct voltage levels and peak currents required by a power JFET.

In order to construct a high temperature gate driver using only small signal WBG (SiC or GaN) N-channel JFETs, an N-channel logic totem pole was first developed. FIG. 10 shows an N-channel logic totem pole 1000 using small signal SiC JFET technology. The devices used in the totem pole may need to conduct significant peak current (e.g., a few amps) and block a few tens of volts.

In order to drive the high side device of the totem pole, the input signal is inverted at the gate. This can be accomplished with an N-channel logic inverter circuit built using only small signal SiC JFETs. There exist three different types of N-channel inverters which can be used: enhancement loaded, depletion loaded, or resistive loaded.

FIG. 11 shows an N-Channel Logic Depletion Load Inverter 1100 using small signal SiC JFET technology. The devices used for the inverter only need to conduct the peak currents required by the gates of the totem pole JFETs (e.g., a few tens of milliamps) and block the same voltage levels.

A buffer circuit can be used between the input control signal and the lower totem pole switch such that any driver failure does not directly damage the user control circuitry. While the signal for only one of the totem pole switches needs to be inverted, the buffer circuit for the lower totem pole FET can be of the inverter type also.

FIGS. 1-6 show various embodiments of gate driver circuits. As shown in FIGS. 1-6, the gate driver circuits are composed of two N-channel logic inverting buffer stages followed by an N-channel logic totem pole.

In accordance with the purposes of this invention, as embodied and broadly described herein, this invention, in one aspect, relates to a non-inverting gate driver.

Referring now to FIG. 1, a circuit diagram of a SiC high temperature ground referenced non-inverting gate driver 100 is shown according to one embodiment of the present invention. FIG. 1 provides a schematic of an embodiment of the N-channel gate drive circuit developed using depletion-mode and enhancement-mode, small signal, N-channel SiC JFETs. In one embodiment, the non-inverting gate driver 100 has: (i) an input $V_{in}$, (ii) an output $V_{out}$, (iii) a first reference line for receiving a first supply voltage $V_{dd}$, (iv) a second reference line for receiving a second supply voltage $V_{ss}$, (v) a ground terminal, (vi) a first JFET Q101, (vii) a second JFET Q102, (viii) a third JFET Q103, (ix) a fourth JFET Q104, (x) a fifth JFET Q105, and (xi) a sixth JFET Q106. Each of the first JFET Q101, the second JFET Q102, the third JFET Q103, the fourth JFET Q104, the fifth JFET Q105, and the sixth JFET Q106 has a gate terminal, a source terminal and a drain terminal.

As shown in FIG. 1, the non-inverting gate driver 100 circuit is arranged in following configuration:

the gate terminal of the first JFET Q101 is electrically coupled to the source terminal of the first JFET Q101, and the drain terminal of the first JFET Q101 is electrically coupled to the first reference line for receiving the first supply voltage $V_{dd}$, respectively;

the gate terminal of the second JFET Q102 is electrically coupled to the input $V_{in}$, the drain terminal of the second JFET Q102 is electronically coupled to the gate terminal and the source terminal of the first JFET Q101, and the source terminal of the second JFET Q102 is electrically coupled to the second reference line for receiving the second supply voltage $V_{ss}$, respectively;

the gate terminal of the third JFET Q103 is electrically coupled to the source terminal of the third JFET Q103, and the drain terminal of the third JFET Q103 is electrically coupled to the first reference line for receiving the first supply voltage $V_{dd}$ and the drain terminal of the first JFET Q101, respectively;

the gate terminal of the fourth JFET Q104 is electrically coupled to the source terminal and the gate terminal of the first JFET Q101 and the drain terminal of the second JFET Q102, the drain terminal of the fourth JFET Q104 is electronically coupled to the gate terminal and the source terminal of the third JFET Q103, and the source terminal of the fourth JFET Q104 is electrically coupled to the second reference line for receiving the second supply voltage $V_{ss}$ and the source terminal of the second JFET Q102, respectively;

the gate terminal of the fifth JFET Q105 is electrically coupled to the source terminal and the gate terminal of the third JFET Q103, and the drain terminal of the fourth JFET Q104, the drain terminal of the fifth JFET Q105 is electrically coupled to the first reference line for receiving the first supply voltage $V_{dd}$, the drain terminal of the third JFET Q103, and the drain terminal of the first JFET Q101, and the source terminal of the fifth JFET Q105 is electrically coupled to the output $V_{out}$, respectively; and the gate terminal of the sixth JFET Q106 is electrically coupled to the gate terminal and the source terminal of the first JFET Q101, the drain terminal of the second JFET Q102, and the gate terminal of the fourth JFET Q104, the drain terminal of the sixth JFET Q106 is electronically coupled to the source terminal of the fifth JFET Q105 and the output $V_{out}$, and the source terminal of the sixth JFET Q106 is electrically coupled to the source terminal of the second JFET Q102, the source terminal of the fourth JFET Q104, and the second reference line for receiving the second supply voltage $V_{ss}$, respectively.

In one embodiment, the first JFET Q101, the second JFET Q102, the third JFET Q103, the fourth JFET Q104, the fifth JFET Q105, and the sixth JFET Q106 of the gate driver 100 are Silicon Carbide N-Channel JFETs.

In one embodiment, the first JFET Q101 and the third JFET Q103 of the gate driver 100 are depletion-mode type JFETs and the second JFET Q102, the fourth JFET Q104, the fifth JFET Q105, and the sixth JFET Q106 of the gate driver 100 are enhancement-mode type JFETs.

In one embodiment, the first reference line for receiving the first supply voltage $V_{dd}$ is electrically coupled to a ground referenced positive source voltage or a switch common referenced positive source voltage. The second reference line for receiving the second supply voltage $V_{ss}$ is electrically coupled to a ground referenced negative source voltage or a switch common referenced negative source voltage. The gate driver in this configuration as shown in FIG. 1 further includes a level-shifting capacitor $C_1$. One terminal of the capacitor $C_1$ is electrically coupled to the input $V_{in}$, and the other terminal of the capacitor $C_1$ is electrically coupled to the gate terminal of the second JFET Q102.

With the addition of one to two additional enhancement-mode JFETs, an enable/disable input can be added to the gate drive circuit. For application of 0V to a $V_{enable}$ input, the output of the gate driver will be enabled. If +5V is applied to the $V_{enable}$ input, the output $V_{out}$ of the gate driver will be disabled. This provides an alternative embodiment of the present invention for any circuit that requires the use of an enabling input. Voltages $V_{dd}$ and $V_{ss}$ can be adjusted to provide the optimal drive voltages for a depletion-mode or enhancement-mode SiC power JFET.

Figure 3:
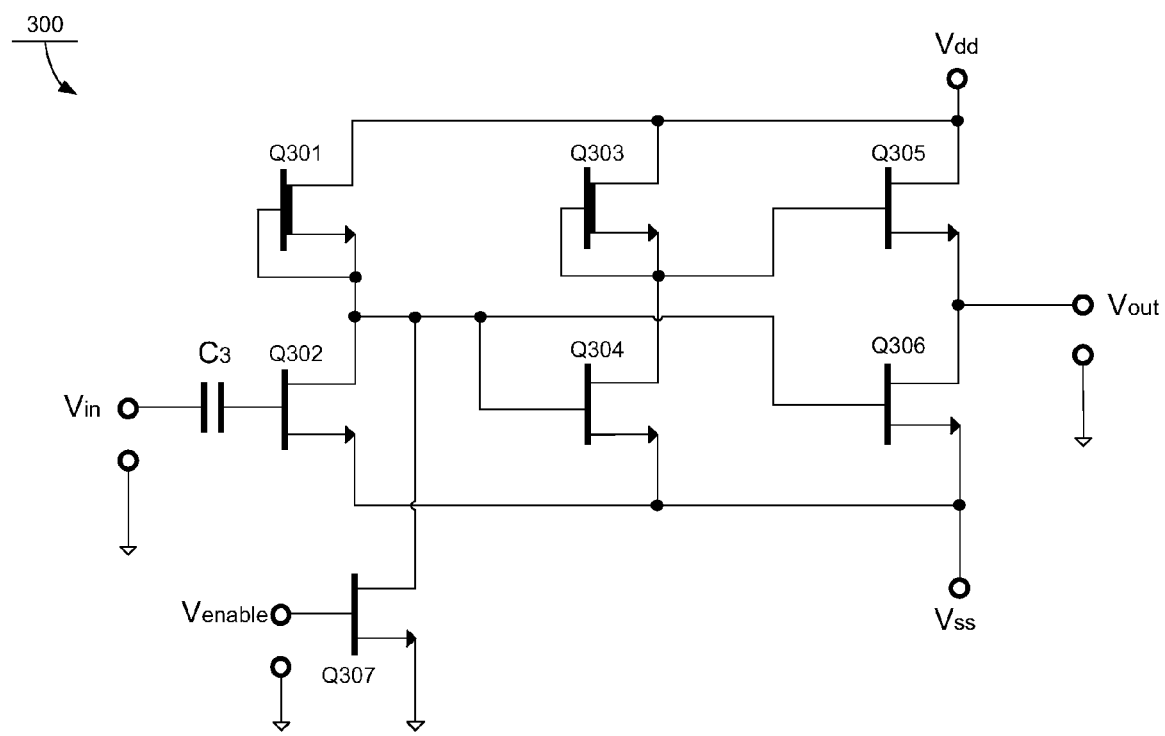
FIG. 3 shows a circuit diagram of a SiC high temperature non-inverting gate driver with a negative source voltage and a voltage $V_{enable}$ input for enabling/disabling the output of the gate driver according to one embodiment of the present invention.

Referring to FIG. 3, a circuit diagram of a SiC high temperature gate driver 300 with a negative source voltage and a voltage $V_{enable}$ input for enabling/disabling the gate driver output according to one embodiment of the present invention. As shown in FIG. 3, the circuit includes: (i) an enable voltage input $V_{enable}$ for enabling or disabling the output $V_{out}$ of the gate driver, and (ii) a seventh JFET Q307. The gate terminal of the seventh JFET Q307 is electrically coupled to the enable voltage input $V_{enable}$, the source terminal of the seventh JFET Q307 is electrically coupled to the ground terminal, and the drain terminal of the seventh JFET Q307 is electrically coupled to the source terminal and the gate terminal of the first JFET Q301, the drain terminal of the second the JFET Q302, the gate terminal of the fourth JFET Q304, the gate terminal of the sixth JFET Q306, and the source terminal of the seventh JFET Q307 is electrically coupled to the ground terminal.

Figure 4:
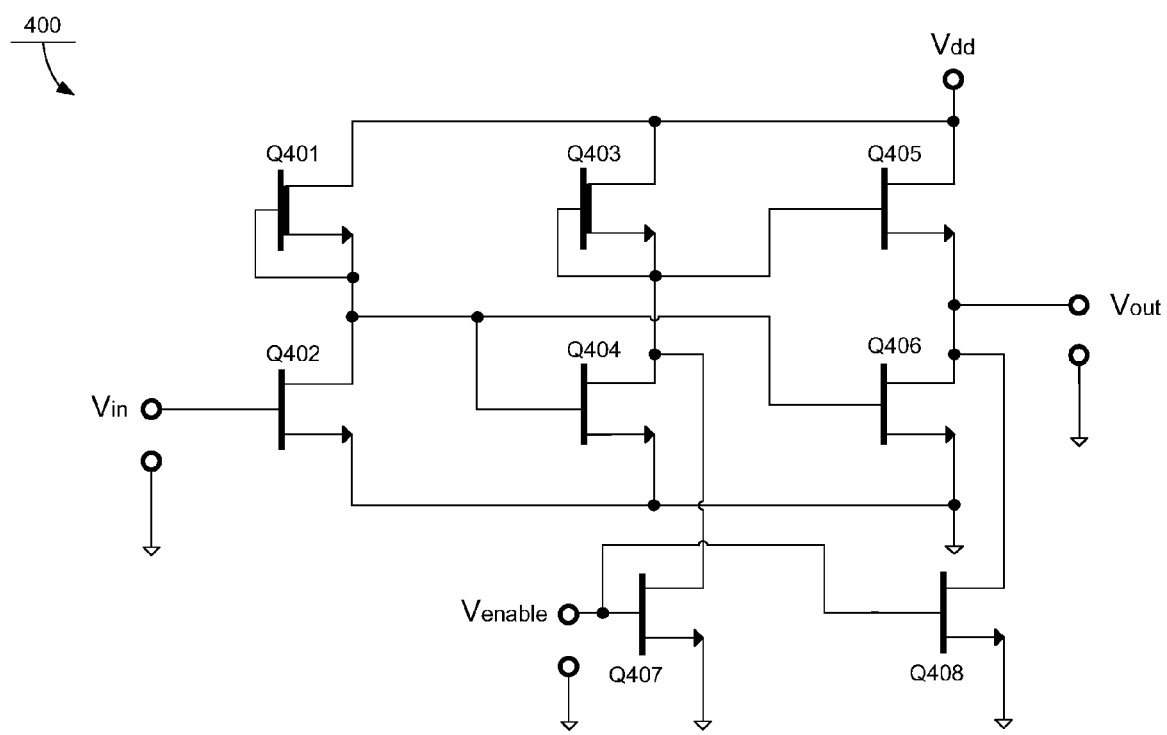
FIG. 4 shows a circuit diagram of a SiC high temperature ground referenced non-inverting gate driver with a voltage $V_{enable}$ input for enabling/disabling the output of the gate driver according to one embodiment of the present invention.

In another embodiment, the first reference line for receiving the first supply voltage $V_{dd}$ is electrically coupled to a ground referenced positive source voltage or a switch common referenced positive source voltage, and the second reference line for receiving the second supply voltage $V_{ss}$ is electrically coupled to the ground terminal or a switch common terminal. A circuit diagram of a SiC high temperature ground referenced non-inverting gate driver 400 with a voltage $V_{enable}$ input for enabling/disabling the gate driver output is illustrated in FIG. 4, according to one embodiment of the present invention. As shown in FIG. 4, the gate driver 400 further includes: (i) an enable voltage input $V_{enable}$ for enabling or disabling the output $V_{out}$ of the gate driver, (ii) a seventh JFET Q407 having a gate terminal, a source terminal and a drain terminal, wherein the gate terminal of the seventh JFET Q407 is electrically coupled to the enable voltage input $V_{enable}$, the source terminal of the seventh JFET Q407 is electrically coupled to the ground terminal; and the drain terminal of the seventh JFET Q407 is electrically coupled to the drain terminal of the fourth JFET Q404, the gate terminal and the source terminal of the third JFET Q403, and the gate terminal of the fifth JFET, respectively, and (iii) an eighth JFET Q408 having a gate terminal, a source terminal and a drain terminal, wherein the gate terminal of the eighth JFET Q408 is electrically coupled to the enable voltage input $V_{enable}$ and the gate terminal of the seventh JFET Q407, the source terminal of the eighth JFET Q408 is electrically coupled to the ground terminal, and the drain terminal of the eighth JFET Q408 is electrically coupled to the drain terminal of the sixth JFET Q406, the source terminal of the fifth JFET Q405, and the output $V_{out}$, respectively.

In one embodiment, the input Vin of the gate driver is a low current, ground referenced input logic signal, or a low current switch common referenced input logic signal. The output $V_{out}$ of the gate driver is a ground referenced signal or a switch common referenced signal.

Figure 5:
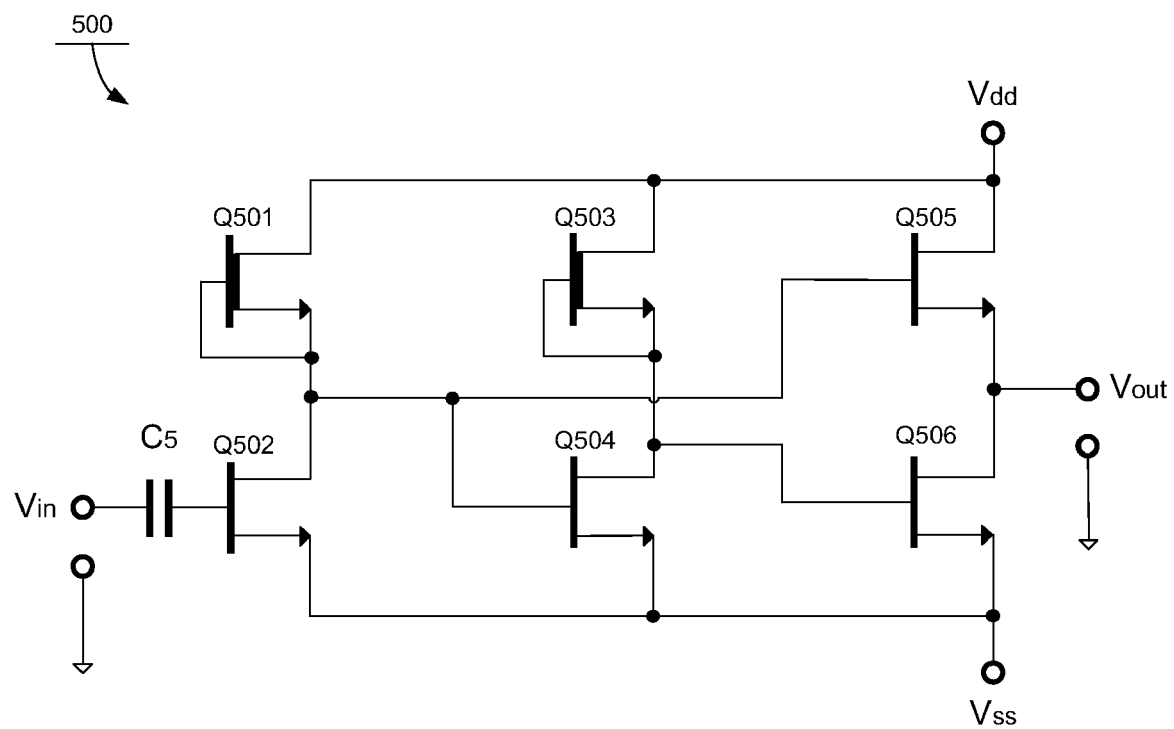
FIG. 5 shows a circuit diagram of a SiC high temperature inverting gate driver with positive and negative source voltages according to one embodiment of the present invention.

In another aspect, the present invention relates to an inverting gate driver. In one embodiment as shown in FIG. 5, the inverting gate driver 500 has: (i) an input $V_{in}$, (ii) an output $V_{out}$, (iii) a first reference line for receiving a first supply voltage $V_{dd}$, (iv) a second reference line for receiving a second supply voltage $V_{ss}$, (v) a ground terminal, (vi) first JFET Q501, (vii) a second JFET Q502, (viii) a third JFET Q503, (ix) a fourth JFET Q504, (x) a fifth JFET Q505, and (xi) a sixth JFET Q506. Each of the first JFET Q501, the second JFET Q502, the third JFET Q503, the fourth JFET Q504, the fifth JFET Q505, and the sixth JFET Q506 has a gate terminal, a source terminal and a drain terminal.

As shown in FIG. 5, the non-inverting gate driver 500 circuit can be arranged in following configuration:

the gate terminal of the first JFET Q501 is electrically coupled to the source terminal of the first JFET Q501, and the drain terminal of the first JFET Q501 is electrically coupled to the first reference line for receiving the first supply voltage $V_{dd}$, respectively;

the gate terminal of the second JFET Q502 is electrically coupled to the input $V_{in}$ through a level-shifting capacitor $C_5$, the drain terminal of the second JFET Q502 is electronically coupled to the gate terminal and the source terminal of the first JFET Q501, and the source terminal of the second JFET Q502 is electrically coupled to the second reference line for receiving the second supply voltage $V_{ss}$, respectively;

the gate terminal of the third JFET Q503 is electrically coupled to the source terminal of the third JFET Q503, and the drain terminal of the third JFET Q503 is electrically coupled to the first reference line for receiving the first supply voltage $V_{dd}$ and the drain terminal of the first JFET Q501, respectively;

the gate terminal of the fourth JFET Q504 is electrically coupled to the source terminal and the gate terminal of the first JFET Q501 and the drain terminal of the second JFET Q502, the drain terminal of the fourth JFET Q504 is electronically coupled to the gate terminal and the source terminal of the third JFET Q503, and the source terminal of the fourth JFET Q504 is electrically coupled to the second reference line for receiving the second supply voltage $V_{ss}$ and the source terminal of the second JFET Q502, respectively;

the gate terminal of the fifth JFET Q505 is electrically coupled to the source terminal and gate of the first JFET Q501, the drain terminal of the second JFET Q502, and the gate terminal of the fourth JFET Q504, the drain terminal of the fifth JFET Q505 is electrically coupled to the first reference line for receiving the first supply voltage $V_{dd}$, the drain terminal of the third JFET Q503, and the drain terminal of the first JFET Q501, and the source terminal of the fifth JFET Q505 is electrically coupled to the output $V_{out}$, respectively, and the gate terminal of the sixth JFET Q506 is electrically coupled to the gate terminal and the source terminal of the third JFET Q503 and the drain terminal of the fourth JFET Q504, the drain terminal of the sixth JFET Q506 is electronically coupled to the source terminal of the fifth JFET Q505 and the output $V_{out}$, and the source terminal of the sixth JFET Q506 is electrically coupled to the source terminal of the second JFET Q502, the source terminal of the fourth JFET Q504 and the second reference line for receiving the second supply voltage $V_{ss}$, respectively.

In one embodiment, the first JFET Q501, the second JFET Q502, the third JFET Q503, the fourth JFET Q504, the fifth JFET Q505, and the sixth JFET Q506 of the gate driver 500 are Silicon Carbide N-Channel JFETs.

In one embodiment, the first JFET Q501 and the third JFET Q503 of the gate driver 500 are depletion-mode type JFETs, and the second JFET Q502, the fourth JFET Q504, the fifth JFET Q505, and the sixth JFET Q506 of the gate driver 500 are enhancement-mode type JFETs.

In the embodiment as shown in FIG. 5, the gate driver's first reference line for receiving the first supply voltage $V_{dd}$ is electrically coupled to a ground referenced positive source voltage or a switch common referenced positive source voltage. The second reference line for receiving the second supply voltage $V_{ss}$ is electrically coupled to a ground referenced negative source voltage or a switch common referenced negative source voltage.

Figure 6:
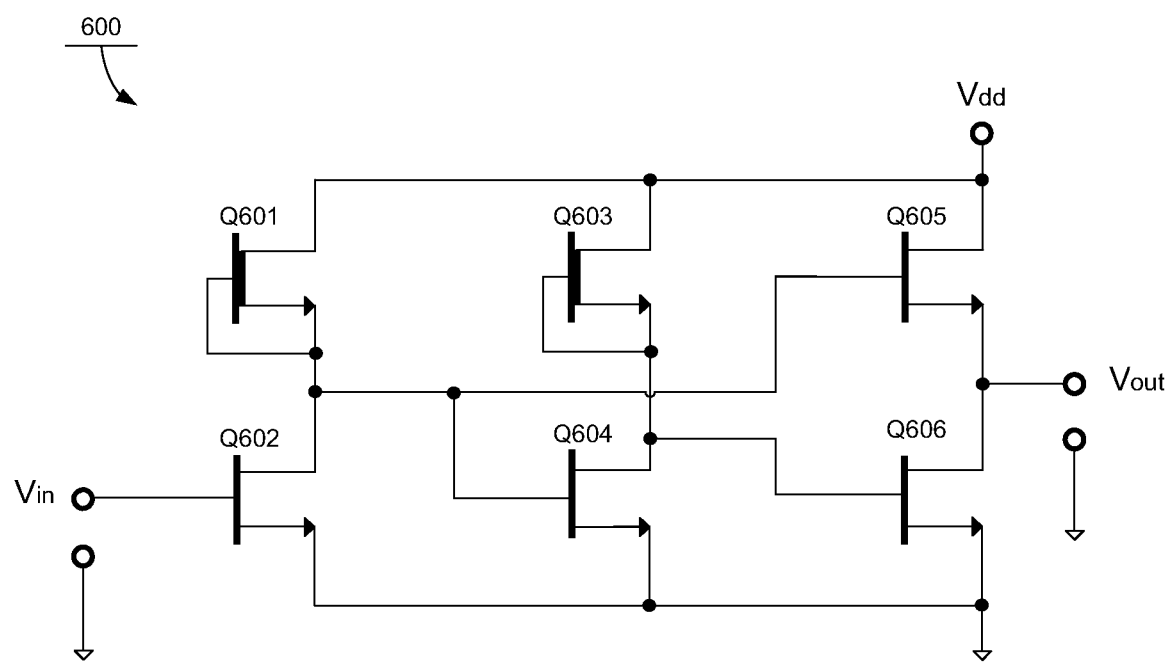
FIG. 6 shows a circuit diagram of a SiC high temperature ground referenced positive source voltage inverting gate driver according to one embodiment of the present invention.

In another embodiment as shown in FIG. 6, the gate driver's first reference line for receiving the first supply voltage $V_{dd}$ is electrically coupled to a ground referenced positive source voltage or a switch common referenced positive source voltage. The second reference line for receiving the second supply voltage $V_{ss}$ is electrically coupled to the ground terminal or a switch common terminal.

In one embodiment, the input $V_{in}$ of the gate driver is a low current, ground referenced input logic signal, or a low current switch common referenced input logic signal. The output $V_{out}$ of the gate driver is a ground referenced signal or a switch common referenced signal.

In FIGS. 1-6, inverting buffer stages can be created based on a resistive load, enhancement load, or depletion load configuration. A first inverting buffer comprising the first and second JFETs drives a second inverter comprising the third and the fourth JFETs, and one of the totem pole transistors, the sixth JFET for the non-inverting circuits and the fifth JFET for the inverting circuits. The first inverter provides enough current amplification to drive one of the totem pole transistors. The second inverter is then used to drive the other totem pole transistor, the fifth JFET for the non-inverting circuits and the sixth JFET for the inverting circuits.

In the other embodiments shown in FIGS. 2-6, the main difference is that the first inverter drives the fifth JFET for the non-inverting circuits instead of the sixth JFET for the inverter circuits, and the second inverter drives the sixth JFET for the non-inverter circuits instead of the fifth JFET for the inverting circuits. For the non-inverting circuits as shown in FIG. 1, as the input control voltage $V_{in}$ transitions to a logic high state, the second JFET (enhancement-mode transistor) is driven into conduction pulling the output of the first inverter low. The first transistor (depletion-mode transistor) is driven into saturation and floats its on-state voltage up to $V_{dd}$. The gate of the fourth JFET (enhancement-mode) is pulled to ground and held in the pinch-off state by the output of the first inverter. The output of the second inverter is then pulled up to $V_{dd}$ by the third JFET (depletion-mode transistor). The output of the second inverter drives the fifth JFET (enhancement-mode transistor) into conduction and pulls the output of the circuit up to $V_{dd}$. Once the input transitions to a logic low state, the second JFET is pinched off and the first JFET pulls the output of the first inverter high. The fourth JFET is turned on pulling the output of the second inverter low. The fifth JFET is pinched off and the sixth JFET is turned on pulling the output of the driver circuit low.

Figure 7:
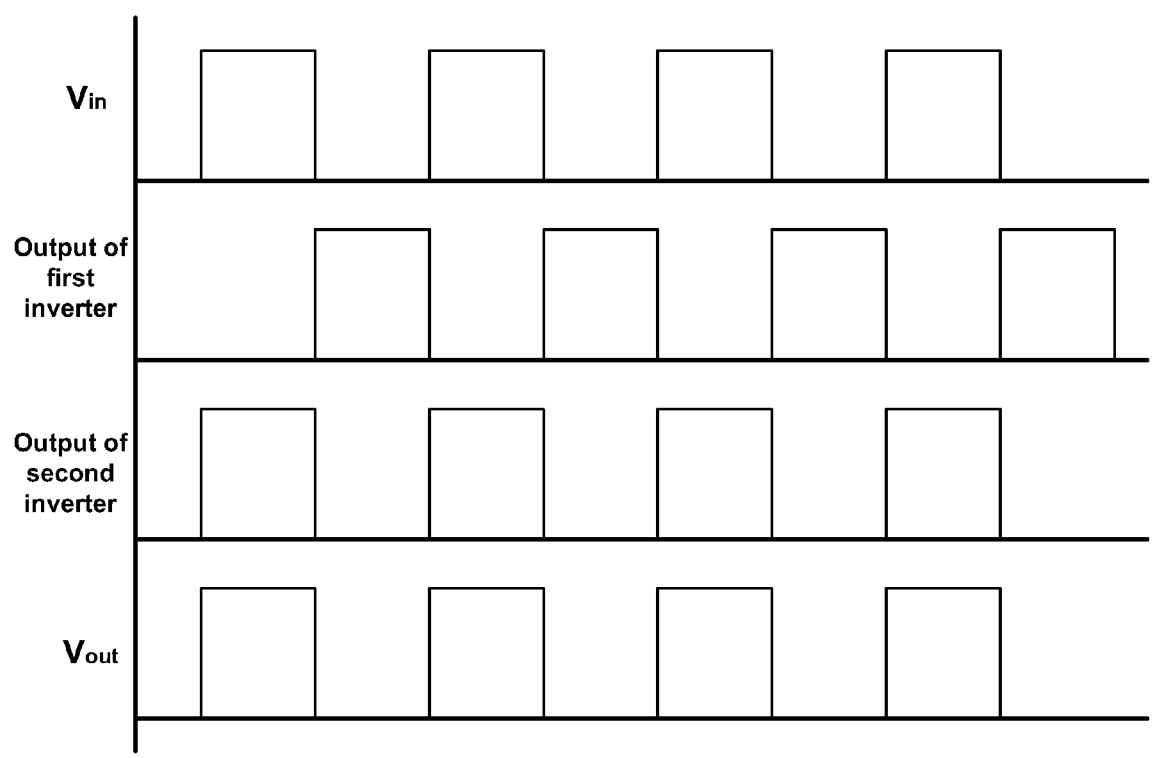
FIG. 7 illustrates the waveform for the non-inverting gate drivers shown in FIGS. 1-4.

FIG. 7 shows the waveforms for the non-inverting gate drivers of FIGS. 1-4.

Figure 8:
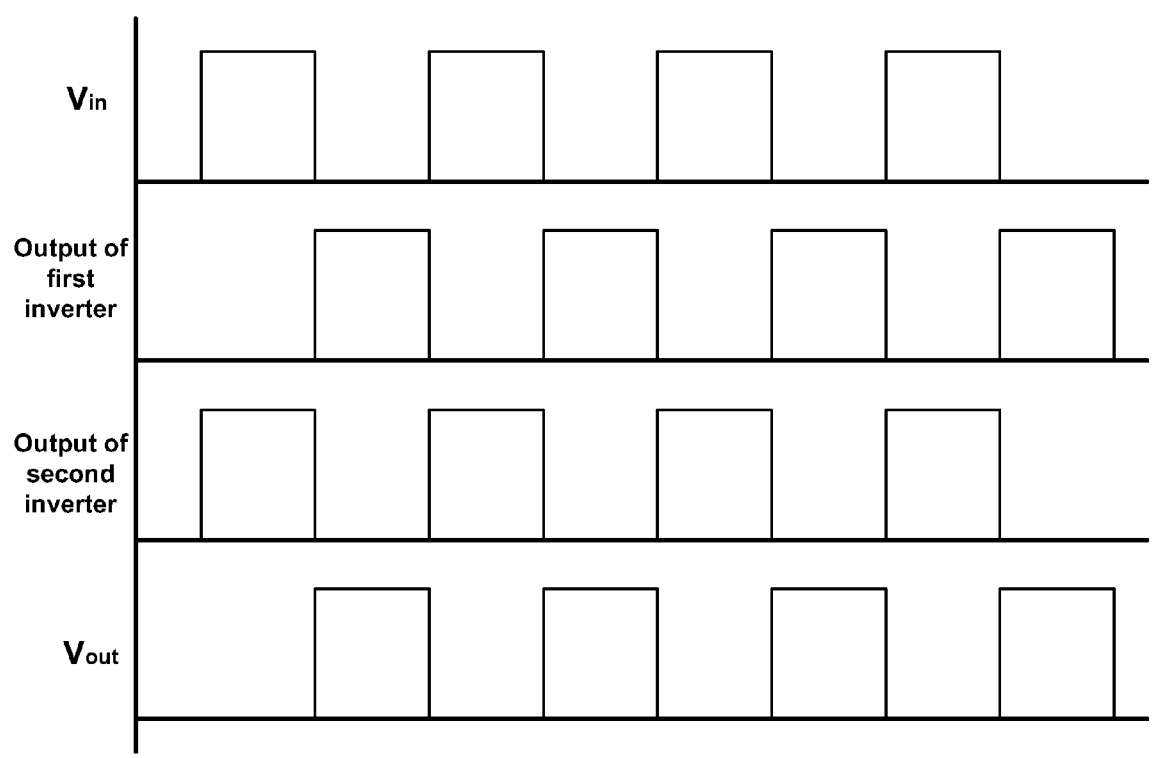
FIG. 8 illustrates the waveform for the inverting gate drivers shown in FIGS. 5-6.

FIG. 8 shows the waveform for the inverting gate drivers of FIGS. 5-6.

Figure 9:
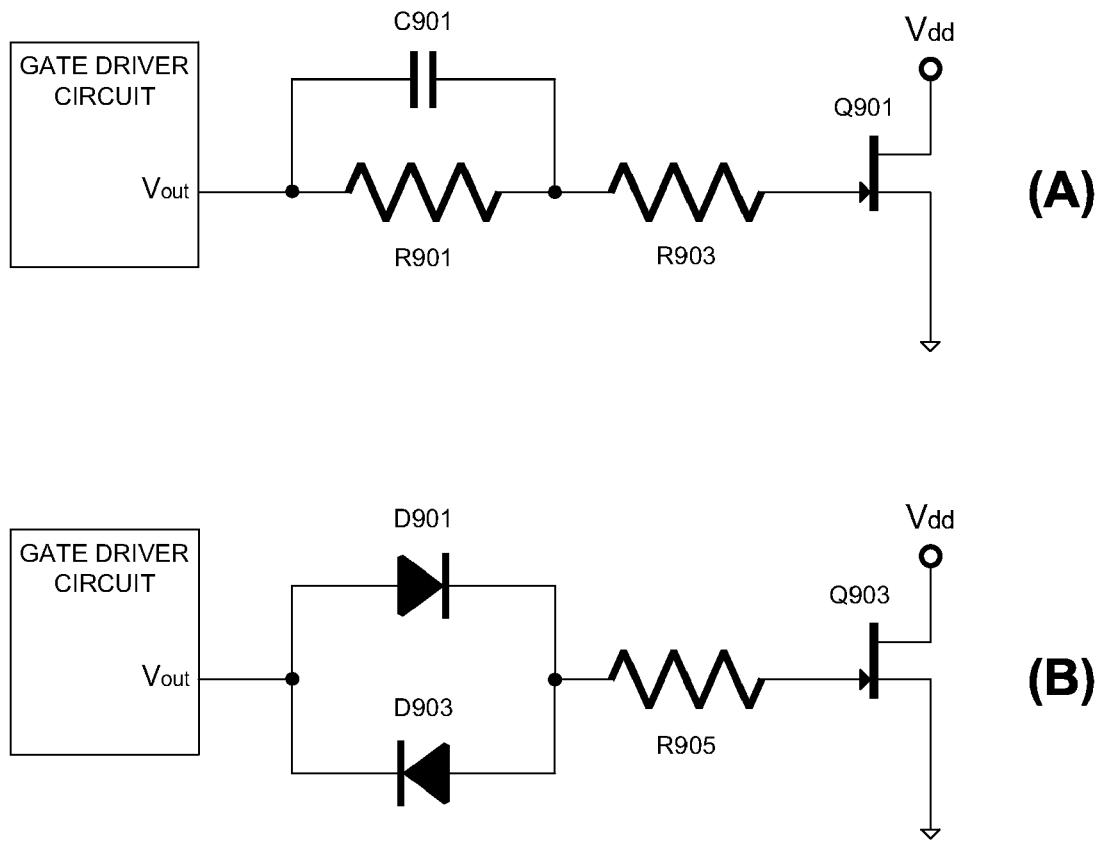
FIG. 9A illustrates an RC drive interface circuit for a gate driver according to one embodiment of the present invention.
FIG. 9B illustrates an anti-parallel drive interface circuit for a gate driver according to one embodiment of the present invention.

In order to take full advantage of the gate drivers of the present invention with the SiC power JFET described earlier, additional driver interface circuits may be used. In FIG. 9A, an RC drive interface circuit is shown according to one embodiment of the present invention. In FIG. 9B, an anti-parallel diode drive interface circuit is shown according to one embodiment of the present invention. These circuits can be used for additional voltage level shifting and gate current control. Additional series gate resistance (whether it be a discrete component or equivalent resistance) may be included to provide additional dV/dt control.

The embodiments of the present invention can be fabricated in various methods depending on the applications.

In one embodiment, the gate driver can be fabricated by using discrete, small signal, silicon carbide, depletion-mode and enhancement-mode, N-channel JFETs.

In another embodiment, the gate driver can be produced in an integrated circuit in a high temperature capable package to provide a single chip gate driver for driving SiC power JFETs. In this configuration, the single chip gate driver can be placed very close to the SiC power JFETs.

In yet another embodiment, the gate driver can be manufactured in a single chip integrated circuit with the power JFET packaged in a high temperature capable package to provide an integrated gate driver/switch solution.

The input control signal can be referenced to the same ground or switch common as the power transistor connected at the output of the driver circuit. This circuit is suitable for most low-side and high-side applications.

The foregoing description of the exemplary embodiments of the invention has been presented only for the purposes of illustration and description and is not intended to be exhaustive or to limit the invention to the precise forms disclosed. Many modifications and variations are possible in light of the above teachings.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

REFERENCES

[1] D. A. Neamen, "Electronic Circuit Analysis and Design," Irwin, 1996, pp. 934-936.

[2] U.S. Pat. No. 3,700,981.

[3] U.S. Pat. No. 4,042,839.

[4] U.S. Pat. No. 3,775,693.

What is claimed is:

1. A non-inverting gate driver comprising:
(a) an input;
(b) an output;
(c) a first reference line for receiving a first supply voltage;
(d) a second reference line for receiving a second supply voltage;
(e) a ground terminal;
(f) a first Junction Field-Effect Transistor (JFET) having a gate terminal, a source terminal and a drain terminal, wherein the gate terminal of the first JFET is electrically coupled to the source terminal of the first JFET, and the drain terminal of the first JFET is electrically coupled to the first reference line for receiving the first supply voltage, respectively;
(g) a second JFET having a gate terminal, a source terminal and a drain terminal, wherein the gate terminal of the second JFET is electrically coupled to the input, the drain terminal of the second JFET is electronically coupled to the gate terminal and the source terminal of the first JFET, and the source terminal of the second JFET is electrically coupled to the second reference line for receiving the second supply voltage, respectively;
(h) a third JFET having a gate terminal, a source terminal and a drain terminal, wherein the gate terminal of the third JFET is electrically coupled to the source terminal of the third JFET, and the drain terminal of the third JFET is electrically coupled to the first reference line for receiving the first supply voltage and the drain terminal of the first JFET, respectively;
(i) a fourth JFET having a gate terminal, a source terminal and a drain terminal, wherein the gate terminal of the fourth JFET is electrically coupled to the source terminal and the gate terminal of the first JFET and the drain terminal of the second JFET, the drain terminal of the fourth JFET is electronically coupled to the gate terminal and the source terminal of the third JFET, and the source terminal of the fourth JFET is electrically coupled to the second reference line for receiving the second supply voltage and the source terminal of the second JFET, respectively;
(j) a fifth JFET having a gate terminal, a source terminal and a drain terminal, wherein the gate terminal of the fifth JFET is electrically coupled to the source terminal and the gate terminal of the third JFET, and the drain terminal of the fourth JFET, the drain terminal of the fifth JFET is electrically coupled to the first reference line for receiving the first supply voltage, the drain terminal of the third JFET, and the drain terminal of the first JFET, and the source terminal of the fifth JFET is electrically coupled to the output, respectively; and
(k) a sixth JFET having a gate terminal, a source terminal and a drain terminal, wherein the gate terminal of the sixth JFET is electrically coupled to the gate terminal and the source terminal of the first JFET, the drain terminal of the second JFET, and the gate terminal of the fourth JFET, the drain terminal of the sixth JFET is electronically coupled to the source terminal of the fifth JFET and the output, and the source terminal of the sixth JFET is electrically coupled to the source terminal of the second JFET, the source terminal of the fourth JFET, and the second reference line for receiving the second supply voltage, respectively.

2. The gate driver of claim 1, wherein the first JFET, the second JFET, the third JFET, the fourth JFET, the fifth JFET, and the sixth JFET each comprise a silicon carbide N-Channel JFET.

3. The gate driver of claim 2, wherein the first JFET and the third JFET each comprise a depletion-mode type JFET, and the second JFET, the fourth JFET, the fifth JFET, and the sixth JFET each comprise an enhancement-mode type JFET.

4. The gate driver of claim 1, wherein the first reference line for receiving the first supply voltage is electrically coupled to a ground referenced positive source voltage or a switch common referenced positive source voltage, and the second reference line for receiving the second supply voltage is electrically coupled to a ground referenced negative source voltage or a switch common referenced negative source voltage.

5. The gate driver of claim 4, further comprising a level-shifting capacitor having a first terminal and a second terminal, wherein the first terminal of the capacitor is electrically coupled to the input, and the second terminal of the capacitor is electrically coupled to the gate terminal of the second JFET.

6. The gate driver of claim 5, further comprising:
(l) an enable voltage input for enabling or disabling the output of the gate driver; and
(m) a seventh JFET having a gate terminal, a source terminal and a drain terminal, wherein the gate terminal of the seventh JFET is electrically coupled to the enable voltage input, the drain terminal of the seventh JFET is electrically coupled to the source terminal and the gate terminal of the first JFET, the drain terminal of the second the JFET, the gate terminal of the fourth JFET, the gate terminal of the sixth JFET, and the source terminal of the seventh JFET is electrically coupled to the ground terminal, respectively.

7. The gate driver of claim 1, wherein the first reference line for receiving the first supply voltage is electrically coupled to a ground referenced positive source voltage or a switch common referenced positive source voltage, and the second reference line for receiving the second supply voltage is electrically coupled to the ground terminal or a switch common terminal.

8. The gate driver of claim 7, further comprising:
(l) an enable voltage input for enabling or disabling the output of the gate driver;
(m) a seventh JFET having a gate terminal, a source terminal and a drain terminal, wherein the gate terminal of the seventh JFET is electrically coupled to the enable voltage input, the drain terminal of the seventh JFET is electrically coupled to the drain terminal of the fourth JFET, the gate terminal and the source terminal of the third JFET, and the gate terminal of the fifth JFET, and the source terminal of the seventh JFET is electrically coupled to the ground terminal, respectively; and
(n) an eighth JFET having a gate terminal, a source terminal and a drain terminal, wherein the gate terminal of the eighth JFET is electrically coupled to the enable voltage input and the gate terminal of the seventh JFET, the drain terminal of the eighth JFET is electrically coupled to the drain terminal of the sixth JFET, the source terminal of the fifth JFET, and the output, and the source terminal of the eighth JFET is electrically coupled to the ground terminal, respectively.

9. The gate driver of claim 1, wherein the input comprises a low current ground referenced input logic signal or a low current switch common referenced input logic signal.

10. The gate driver of claim 1, wherein the output comprises a ground referenced signal or a switch common referenced signal.

11. An integrated circuit comprising:
the non-inverting gate driver of claim 1;
optionally, an RC drive interface circuit or an anti-parallel diode drive interface circuit; and
a wide-bandgap semiconductor power JFET.

12. The integrated circuit of claim 11, wherein the wide-bandgap semiconductor power JFET is a SiC power JFET.

13. An inverting gate driver comprising:
(a) an input;
(b) an output;
(c) a first reference line for receiving a first supply voltage;
(d) a second reference line for receiving a second supply voltage;
(e) a ground terminal;
(f) a first JFET having a gate terminal, a source terminal and a drain terminal, wherein the gate terminal of the first JFET is electrically coupled to the source terminal of the first JFET, and the drain terminal of the first JFET is electrically coupled to the first reference line for receiving the first supply voltage, respectively;
(g) a second JFET having a gate terminal, a source terminal and a drain terminal, wherein the gate terminal of the second JFET is electrically coupled to the input, the drain terminal of the second JFET is electronically coupled to the gate terminal and the source terminal of the first JFET, and the source terminal of the second JFET is electrically coupled to the second reference line for receiving the second supply voltage, respectively;
(h) a third JFET having a gate terminal, a source terminal and a drain terminal, wherein the gate terminal of the third JFET is electrically coupled to the source terminal of the third JFET, and the drain terminal of the third JFET is electrically coupled to the first reference line for receiving the first supply voltage and the drain terminal of the first JFET, respectively;
(i) a fourth JFET having a gate terminal, a source terminal and a drain terminal, wherein the gate terminal of the fourth JFET is electrically coupled to the source terminal and the gate terminal of the first JFET, and the drain terminal of the second JFET, the drain terminal of the fourth JFET is electronically coupled to the gate terminal and the source terminal of the third JFET, and the source terminal of the fourth JFET is electrically coupled to the second reference line for receiving the second supply voltage and the source terminal of the second JFET, respectively;
(j) a fifth JFET having a gate terminal, a source terminal and a drain terminal, wherein the gate terminal of the fifth JFET is electrically coupled to the source terminal and gate terminal of the first JFET, the drain terminal of the second JFET, and the gate terminal of the fourth JFET, the drain terminal of the fifth JFET is electrically coupled to the first reference line for receiving the first supply voltage, the drain terminal of the third JFET, and the drain terminal of the first JFET, and the source terminal of the fifth JFET is electrically coupled to the output, respectively; and
(k) a sixth JFET having a gate terminal, a source terminal and a drain terminal, wherein the gate terminal of the sixth JFET is electrically coupled to the gate terminal and the source terminal of the third JFET and the drain terminal of the fourth JFET, the drain terminal of the sixth JFET is electronically coupled to the source terminal of the fifth JFET and the output, and the source terminal of the sixth JFET is electrically coupled to the source terminal of the second JFET, the source terminal of the fourth JFET and the second reference line for receiving the second supply voltage, respectively.

14. The gate driver of claim 13, wherein the first JFET, the second JFET, the third JFET, the fourth JFET, the fifth JFET, and the sixth JFET each comprise a silicon carbide N-Channel JFET.

15. The gate driver of claim 14, wherein the first JFET and the third JFET each comprise a depletion-mode type JFET, and the second JFET, the fourth JFET, the fifth JFET, and the sixth JFET each comprise an enhancement-mode type JFET.

16. The gate driver of claim 13, wherein the first reference line for receiving the first supply voltage is electrically coupled to a ground referenced positive source voltage or a switch common referenced positive source voltage, and the second reference line for receiving the second supply voltage is electrically coupled to a ground referenced negative source voltage or a switch common referenced negative source voltage.

17. The gate driver of claim 16, further comprising a level-shifting capacitor having a first terminal and a second terminal, wherein the first terminal of the capacitor is electrically coupled to the input, and the second terminal of the capacitor is electrically coupled to the gate terminal of the second JFET.

18. The gate driver of claim 13, wherein the first reference line for receiving the first supply voltage is electrically coupled to a ground referenced positive source voltage or a switch common referenced positive source voltage, and the second reference line for receiving the second supply voltage is electrically coupled to the ground terminal or a switch common terminal.

19. The gate driver of claim 13, wherein the input comprises a low current ground referenced input logic signal or a low current switch common referenced input logic signal.

20. The gate driver of claim 13, wherein the output comprises a ground referenced signal or a switch common referenced signal.

21. An integrated circuit comprising:
the inverting gate driver of claim 13;
optionally, an RC drive interface circuit or an anti-parallel diode drive interface circuit; and
a wide-bandgap semiconductor power JFET.

22. The integrated circuit of claim 21, wherein the wide-bandgap semiconductor power JFET is a SiC power JFET.

* * * * *